United States Patent
Kang

(10) Patent No.: US 8,237,156 B2
(45) Date of Patent: Aug. 7, 2012

(54) ORGANIC LIGHT EMITTING DISPLAY DEVICE AND METHOD OF MANUFACTURING THE SAME

(75) Inventor: Jin-Kyu Kang, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 150 days.

(21) Appl. No.: 12/662,583

(22) Filed: Apr. 23, 2010

(65) Prior Publication Data
US 2010/0270538 A1 Oct. 28, 2010

(30) Foreign Application Priority Data

Apr. 23, 2009 (KR) .................. 10-2009-0035523

(51) Int. Cl.
*H01L 35/24* (2006.01)
(52) U.S. Cl. ........ 257/40; 257/59; 257/72; 257/E51.001
(58) Field of Classification Search ............... 257/40, 257/59, 72, E51.001
See application file for complete search history.

(56) References Cited

U.S. PATENT DOCUMENTS

| 6,287,899 | B1 | 9/2001 | Park et al. |
| 2007/0152220 | A1 | 7/2007 | Kwack |
| 2007/0187689 | A1 | 8/2007 | Oh et al. |
| 2008/0111135 | A1 | 5/2008 | Choi et al. |
| 2009/0267087 | A1 | 10/2009 | Yang et al. |

FOREIGN PATENT DOCUMENTS

| KR | 100670050 B1 | 1/2007 |
| KR | 1020070071491 A | 7/2007 |
| KR | 1020070082157 A | 8/2007 |

OTHER PUBLICATIONS

The Registration Determination Certificate issued by Korean Intellectual Property Office on Jun. 23, 2011, corresponding to Korean Patent Application No. 10-2009-0035523 and Request for Entry of the Accompanying Office Action attached herewith.

*Primary Examiner* — Anthony Ho
(74) *Attorney, Agent, or Firm* — Robert E. Bushnell, Esq.

(57) ABSTRACT

Provided are an organic light emitting display device and a method of manufacturing the same. The organic light emitting display device includes a substrate; at least one thin film transistor including a gate electrode including a metal oxide layer and a metal layer, a semiconductor layer including source/drain regions and a channel layer; at least one capacitor including a first electrode formed on a layer on which the gate electrode is formed by using a material forming the gate electrode, and a second electrode formed on a layer on which the source/drain electrodes are formed by using a material used to form the source/drain electrodes; and at least one organic light emitting device including a pixel electrode formed on a layer on which the gate electrode is formed by using a material used to form the gate electrode and connected to the source/drain electrodes via a contact hole.

21 Claims, 11 Drawing Sheets

ORGANIC LIGHT EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 23 Apr. 2009 and there duly assigned Serial No. 10-2009-0035523.

BACKGROUND OF THE INVENTION

1. Field of the Invention

An embodiment of the present invention relates to an organic light emitting display device and a method of manufacturing the same, and more particularly, to an active matrix organic light emitting display device including a bottom gate type thin film transistor manufactured by a simplified manufacturing process and a method of manufacturing the active matrix organic light emitting display device.

2. Description of the Related Art

Organic light emitting display devices are self-emitting display devices that include a pixel electrode, an opposite electrode, and an organic light emitting layer disposed between the pixel electrode and the opposite electrode, and have wide viewing angles, excellent contrast, and quick response. Therefore, the organic light emitting display devices have been considered as the next generation of display devices.

Organic light emitting display devices may be manufactured in an active matrix (AM) configuration in which a pixel electrode of each of the pixels is connected to at least one thin film transistor and one capacitor in order to improve resolution and image quality, to increase lifetime, and to reduce power consumption.

SUMMARY OF THE INVENTION

It is therefore one aspect of the present invention to provide an improved organic light emitting display device requiring lower manufacture cost, less manufacture time and simplified manufacture process and to provide an improved method of manufacturing the organic light emitting display device.

It is another aspect of the present invention to provide an improved organic light emitting display device manufactured using a simplified manufacturing process including a reduced number of mask patterning processes and an improved method of manufacturing the organic light emitting display device.

In accordance with an aspect of the present invention, an organic light emitting display device includes a substrate; at least one thin film transistor including a gate electrode formed on the substrate, and the gate electrode including a metal oxide layer and a metal layer, a semiconductor layer including source/drain regions and a channel layer, a gate insulating layer being formed between the gate electrode and the semiconductor layer, and source/drain electrodes connected to the source/drain regions; at least one capacitor including a first electrode formed on a layer on which the gate electrode is formed using a material used to form the gate electrode, and a second electrode formed on a layer on which the source/drain electrodes are formed using a material used to form the source/drain electrodes, wherein the gate insulating layer is formed between the first electrode and the second electrode of the capacitor; and at least one organic light emitting device including a pixel electrode formed on a layer on which the gate electrode is formed using a material used to form the gate electrode and connected to the source/drain electrodes via a contact hole, an organic light emitting layer disposed on the pixel electrode, and an opposite electrode covering the organic light emitting layer.

The organic light emitting display device may further include a pixel defining layer covering edges of the pixel electrode, the thin film transistor, and the capacitor.

The metal oxide layer and the metal layer may be sequentially stacked on the substrate.

The metal layer of the pixel electrode may be positioned only on edges of the metal oxide layer.

Light emitted from the organic light emitting layer may proceed to the substrate side so that an image is formed on the substrate side.

The semiconductor layer may be formed of polycrystal silicon.

The source/drain regions may be doped with an impurity.

The organic light emitting display device may further include the semiconductor layer between the second electrode of the capacitor and the gate insulating layer.

The metal oxide layer may include at least one metal oxide selected from the group consisting of ITO, IZO, ZnO, and $In_2O_3$.

The metal layer may include at least one metal selected from the group consisting of Mo, Cr, Ti, Ag, Mg, Al, Pt, Pd, Au, Ni, Nd, Ir, Li, and Ca.

The organic light emitting display device may further include a buffer layer on the substrate.

In accordance with another aspect of the present invention, a method of manufacturing an organic light emitting display device includes a first mask operation including simultaneously forming a pixel electrode of an organic light emitting device, a gate electrode of a thin film transistor, and a first electrode of a capacitor by sequentially depositing a metal oxide layer and a first metal layer on a substrate; a second mask operation including sequentially depositing a gate insulating layer and a semiconductor layer on the structure formed by the first mask operation, forming a contact hole by exposing a portion of the pixel electrode, and forming source/drain regions and a channel layer between the source/drain regions by doping an impurity on a portion of the semiconductor layer of the thin film transistor; a third mask operation including simultaneously forming source/drain electrodes connected to the source/drain regions of the thin film transistor and a second electrode of a capacitor by depositing a second metal layer on the structure formed by the second mask operation, and connecting one of the source/drain electrodes to the pixel electrode via the contact hole; and a fourth mask operation including forming a pixel defining layer including an opening so as to expose a portion of the pixel electrode by depositing a material used to form the pixel defining layer on the structure formed by the third mask operation.

The semiconductor layer may be formed by forming amorphous silicon on the substrate and crystallizing the amorphous silicon in the second mask operation.

The second mask operation may be performed using a half-tone mask including a light-transmitting portion corresponding to the contact hole, and a light semi-transmitting portion corresponding to the source/drain regions.

The third mask operations may be performed using a half-tone mask including a light-transmitting portion corresponding to the pixel electrode, and a light semi-transmitting portion corresponding to a channel region.

The fourth mask operation may be performed by forming the pixel defining layer so as to expose the metal oxide layer forming the pixel electrode.

The second mask operation may be performed by forming the capacitor such that the semiconductor layer is formed between the second electrode of the capacitor and the gate insulating layer.

The second mask operation may be performed using a half-tone mask including a light-transmitting portion corresponding to the contact hole, and light semi-transmitting portions respectively corresponding to the source/drain regions and the first electrode of the capacitor.

The metal oxide layer may include at least one metal oxide selected from the group consisting of ITO, IZO, ZnO and $In_2O_3$ in the first mask operation.

The metal layer may include at least one metal selected from the group consisting of Mo, Cr, Ti, Ag, Mg, Al, Pt, Pd, Au, Ni, Nd, Ir, Li, and Ca in the first mask operation.

The method may further include forming a buffer layer on the substrate before the first mask operation.

The method may further include forming an organic light emitting layer and an opposite electrode on the structure formed by the fourth mask operation.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
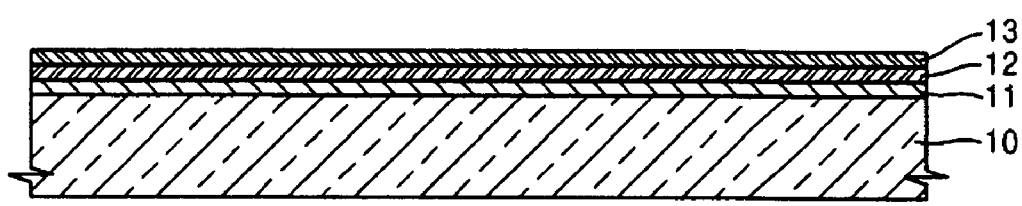
FIGS. 1 through 4 are schematic cross-sectional views illustrating a first mask operation constructed as an embodiment of the present invention.

Hereinafter, the present invention will now be described more fully with reference to the accompanying drawings, in which exemplary embodiments of the invention are shown.

Here, when one element is referred to as being connected to another element, one element may not only be directly connected to another element but instead may be indirectly connected to another element via one or more other elements. Also, when an element is referred to as being "on" another element, it can be directly on the another element or be indirectly on the another element with one or more intervening elements interposed therebetween. Further, some of the elements that are not essential to the complete description of the invention have been omitted for clarity. In addition, like reference numerals refer to like elements throughout.

Organic light emitting display devices may be manufactured in an active matrix (AM) configuration in which a pixel electrode of each of the pixels is connected to at least one thin film transistor and one capacitor. In order to form a micro pattern including a plurality of thin film transistors on a substrate of an AM type organic light emitting display device, a mask operation including photo-lithography is used. The photo-lithography is performed by uniformly coating a photoresistor on a substrate on which a micro pattern will be formed, exposing the photoresistor by using exposure equipment in accordance with a mask pattern, and developing the sensitized photoresistor when the photoresistor is a positive photoresistor. After developing the photoresistor, the pattern is etched by using the remaining photoresistor as a mask, and unnecessary photoresistor is removed.

In a process of transferring a pattern to a substrate by using a mask, the mask including the pattern is prepared before performing the transfer. Thus, as the number of mask patterning processes increases, the cost for preparing the masks increases. In addition, due to the complicated manufacture processes, time and costs required for manufacturing the organic light emitting display device increase. Therefore, an improved organic light emitting display device and an improved method of manufacturing the same are required.

An organic light emitting display device and a method of manufacturing the same constructed as an embodiment of the present invention will be described in detail with reference to FIGS. 1 through 16.

Figure 12:
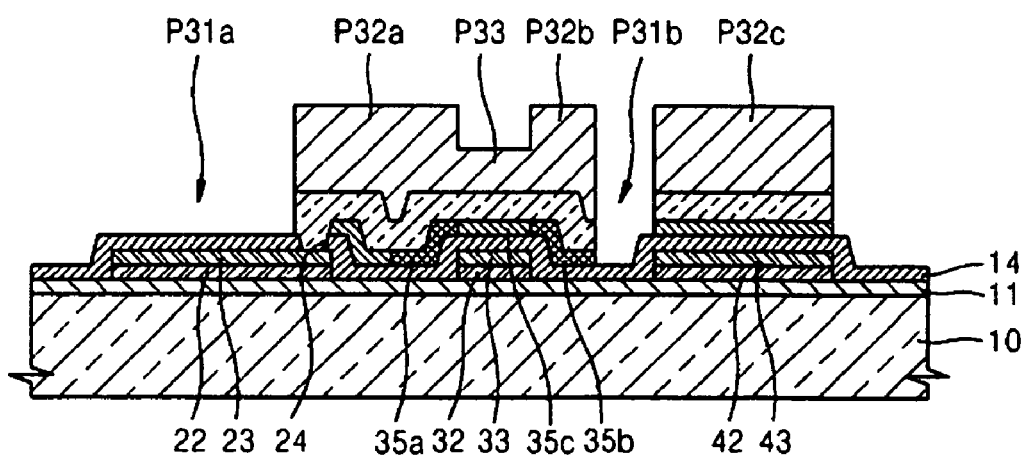
Figure 13:
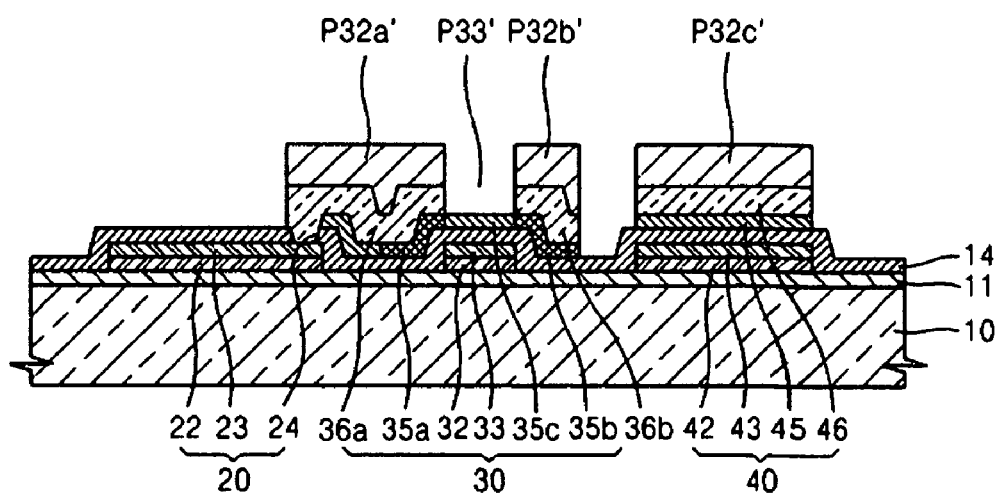
Figure 14:
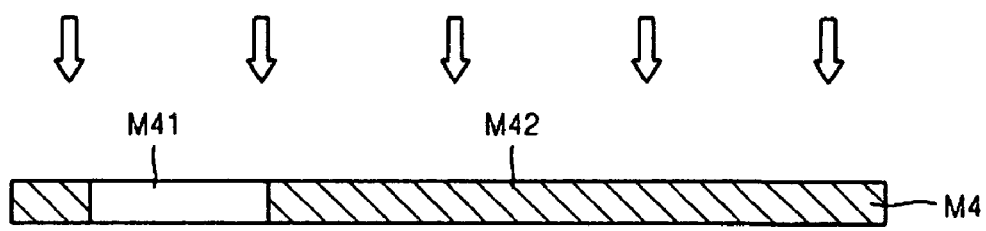
FIGS. 14 and 15 are schematic cross-sectional views illustrating a fourth mask operation constructed as an embodiment of the present invention.
Figure 14:
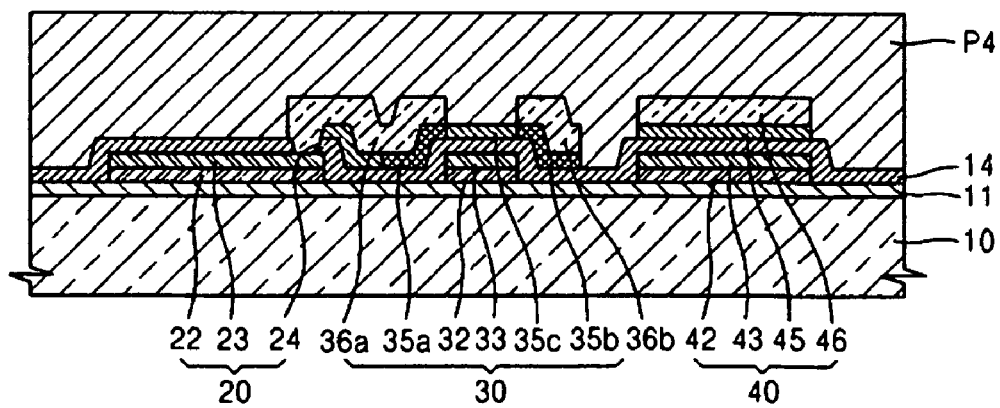
Figure 15:
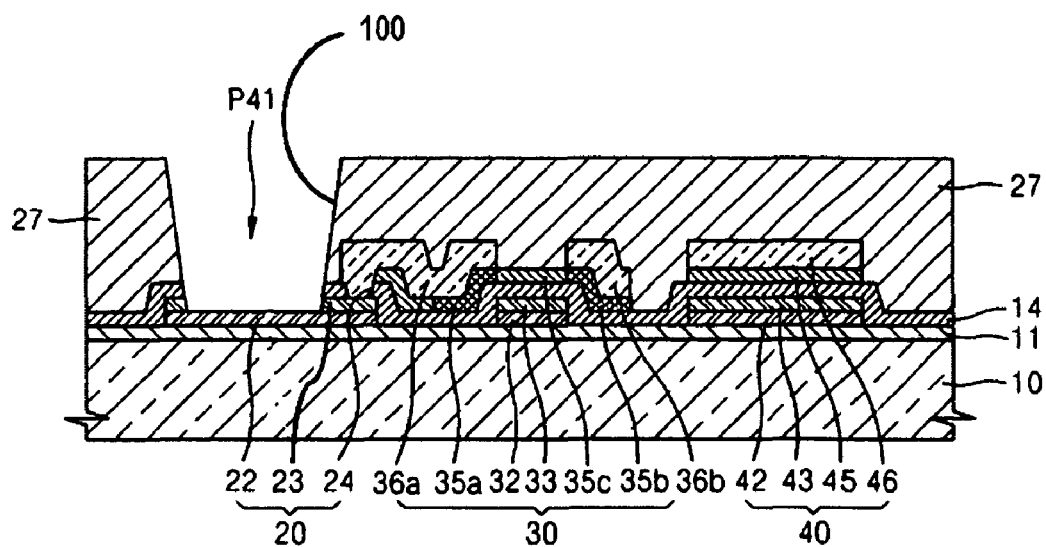
Figure 16:
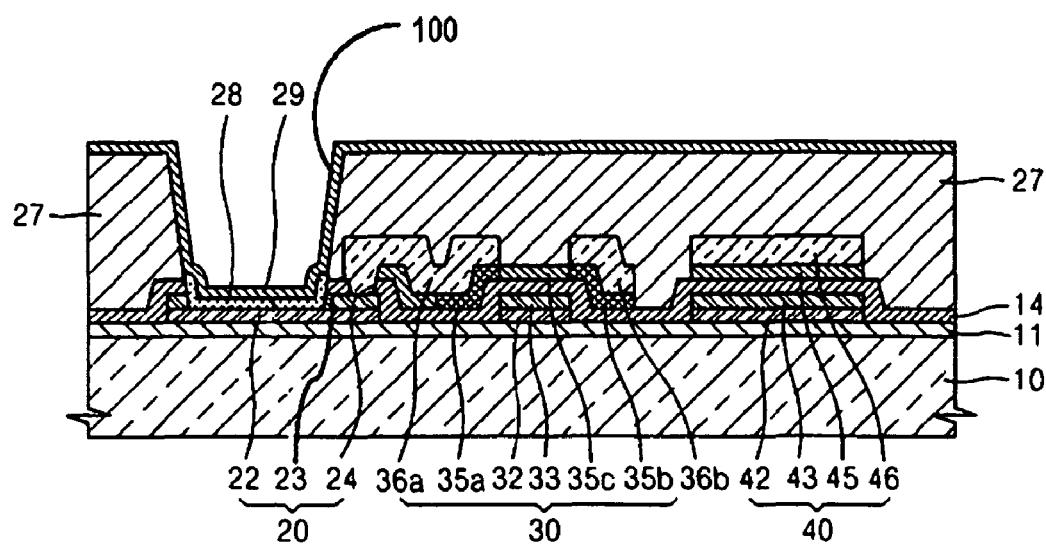
FIG. 16 is a cross-sectional view of an organic light emitting display device formed by a manufacture process including the first through fourth mask operations as shown in FIGS. 1 through 15.

FIGS. 1 through 4 are schematic cross-sectional views illustrating a first mask operation constructed as an embodiment of the present invention, FIGS. 5 through 9 are schematic cross-sectional views illustrating a second mask operation, FIGS. 10 through 13 are schematic cross-sectional views illustrating a third mask operation, FIGS. 14 through 15 are schematic cross-sectional views illustrating a fourth mask operation, and FIG. 16 is a schematic cross-sectional view of an organic light emitting display device formed by the first through fourth mask operations as shown in FIGS. 1 through 15.

Turning now to FIGS. 1 through 4. Referring to FIG. 1, a buffer layer 11, a metal oxide layer 12, and a metal layer 13 are sequentially deposited on a substrate 10.

Substrate 10 may include a transparent glass material including $SiO_2$ as a main component. Substrate 10 may also include an opaque material and any other material such as a plastic material. A bottom emission type organic light emitting display device however should have a transparent substrate 10, which will be described later.

A buffer layer 11 may be formed on substrate 10 to enhance smoothness and to block impurities. Buffer layer 11 may include $SiO_2$ and/or SiNx and may be formed by using plasma enhanced chemical vapor deposition (PECVD), atmospheric pressure chemical vapor deposition (APCVD), low pressure chemical vapor deposition (LPCVD), or the like.

A metal oxide layer 12 including a metal oxide such as ITO, IZO, ZnO, or $In_2O_3$ is formed on buffer layer 11, and a first metal layer 13 including Ag, Mg, Al, Pt, Pd, Au, Ni, Nd, Ir, Cr, Li, Ca, Mo, Ti or a combination thereof may be formed on metal oxide layer 12.

Figure 2:
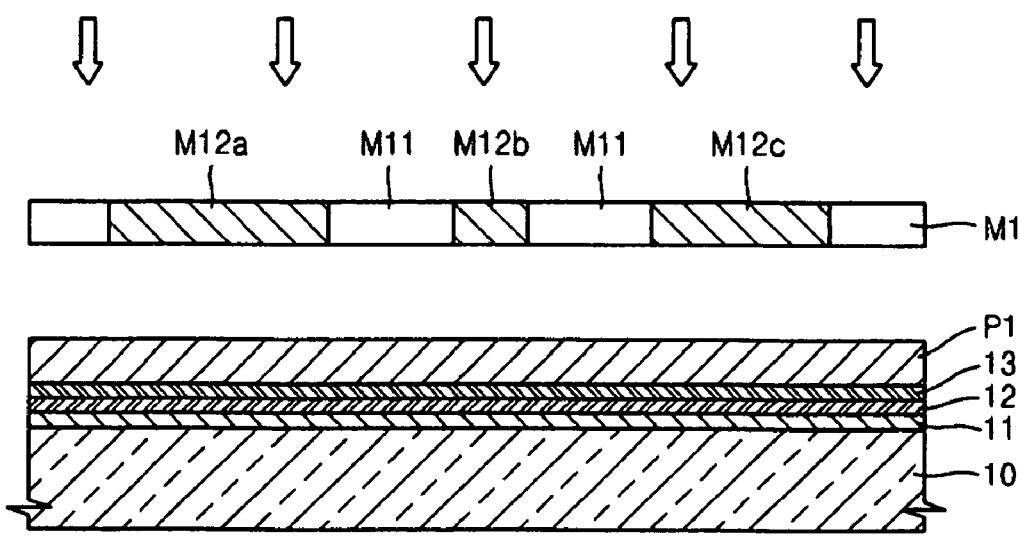

Referring to FIG. 2, a first photoresistor P1 from which a solvent is removed by pre-baking or soft baking is coated on metal oxide layer 12 and the first metal layer 13, and a first mask M1 having a predetermined pattern for patterning photoresistor P1 is disposed on substrate 10.

The first mask M1 includes a light-transmitting portion M11 and light-blocking portions M12a, M12b, and M12c. The light-transmitting portion M11 transmits light having a predetermined wavelength, and light-blocking portions M12a, M12b, and M12c block irradiated light. The first mask M1 is disposed on substrate 10 and light having a predetermined wavelength is irradiated to sensitize the first photoresistor P1.

Figure 3:
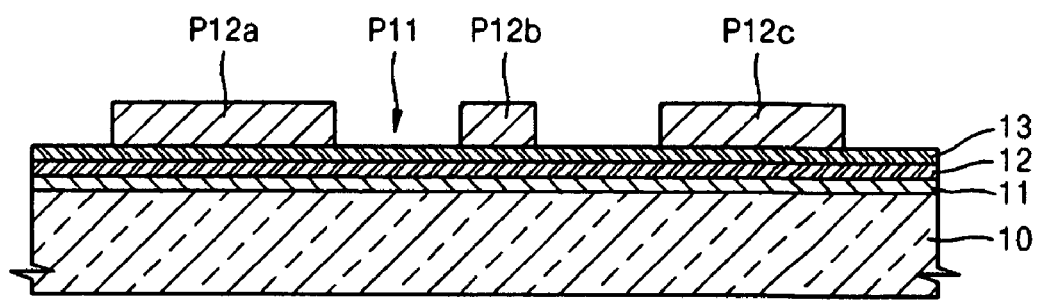

FIG. 3 schematically illustrates a pattern of the first photoresistor P1 remaining after the sensitized portion is removed by a developing process. Referring to FIG. 3, a positive-photoresistor (PR) is used to remove the sensitized portion. However, the present invention is not limited thereto, and a negative-PR may also be used.

Referring to FIG. 3, a photoresistor portion P11 corresponding to light-transmitting portion M11 of the first mask M1 is removed, and photoresistor portions P12a, P12b, and P12c corresponding to light-blocking portions M12a, M12b, and M12c remain.

Figure 4:
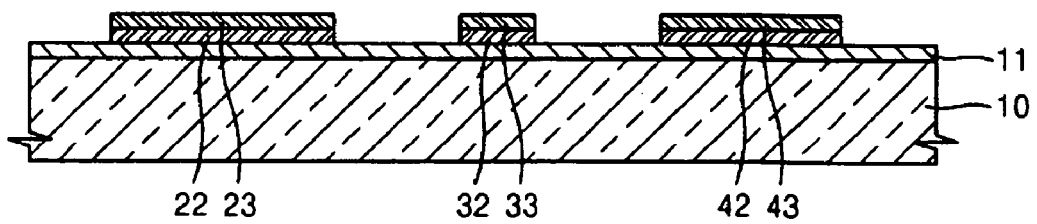

FIG. 4 illustrates a pattern formed on substrate 10 after an etching process by using the remaining photoresistor portions P12a, P12b, P12c. Metal oxide layer 12 and the first metal layer 13 are respectively patterned to pixel electrodes 22 and 23 of an organic light emitting device 20 (FIG. 16), gate electrodes 32 and 33 of a thin film transistor 30 (FIG. 16), and first electrodes 42 and 43 of a capacitor 40 (FIG. 16), which will be described later, by a photo etching process by using the first mask M1 having a predetermined pattern. In this regard, wet etching or dry etching may be used. The dry etching may be performed by plasma etching, reactive ion etching (RIE), reactive sputter etching, reactive ion beam milling, or the like.

Turning now to FIGS. 5 through 9.

Figure 5:
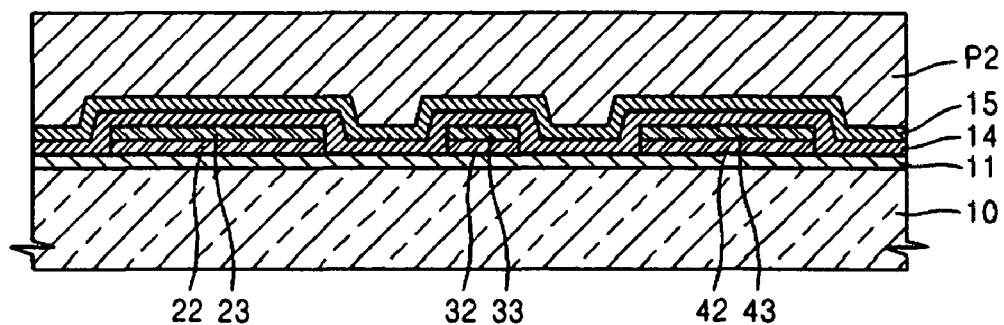
FIGS. 5 through 9 are schematic cross-sectional views illustrating a second mask operation constructed as an embodiment of the present invention.

Referring to FIG. 5, a gate insulating layer 14 is deposited on pixel electrodes 22 and 23 of an organic light emitting device 20 (FIG. 16), gate electrodes 32 and 33 of a thin film transistor 30 (FIG. 16), and the first electrodes 42 and 43 of capacitor 40 which are formed by the first mask operation as shown in FIGS. 1 through 4. Gate insulating layer 14 may be deposited using an inorganic insulating layer formed of SiNx or SiOx by PECVD, APCVD, LPCVD, enhanced reflectivity coating (ERC), or the like.

A semiconductor layer 15 is formed on gate insulating layer 14. Semiconductor layer 15 is formed by depositing amorphous silicon on gate insulating layer 14 and crystallizing the amorphous silicon to obtain polycrystal silicon. The amorphous silicon may be crystallized to the polycrystal silicon using various methods such as rapid thermal annealing (RTA), solid phase crystallization (SPC), excimer laser Annealing (ELA), metal induced crystallization (MIC), metal induced lateral crystallization (MILC), and sequential lateral solidification (SLS).

A second photoresistor P2 is coated on semiconductor layer 15, and a second mask M2 having a predetermined pattern for patterning photoresistor P2 is disposed on substrate 10.

The second mask M2 is a half-tone mask including a light-transmitting portion M21, light-blocking portions M22a, M22b, and M22c, and light semi-transmitting portion M23a and M23b. Light-transmitting portion M21 transmits light having a predetermined wavelength, light-blocking portions M22a, M22b, and M22c block irradiated light, and light semi-transmitting portions M23a and M23b transmit a part of the irradiated light. The half-tone mask M2 shown in FIG. 5 is to explain functions of components of the mask. Practically, the half-tone mask M2 may be formed on a transparent substrate such as quartz to have a predetermined pattern. In this regard, light-blocking portions M22a, M22b, and M22c are formed by patterning Cr or $CrO_2$ on a quartz substrate, and light semi-transmitting portions M23a and M23b may control light transmittance by using at least one selected from the group consisting of Cr, Si, Mo, Ta, and Al and regulating the ratio and the thickness of the composition thereof.

The second mask M2 having the pattern is disposed on substrate 10, and the second photoresistor P2 is exposed to light having a predetermined wavelength.

Figure 6:
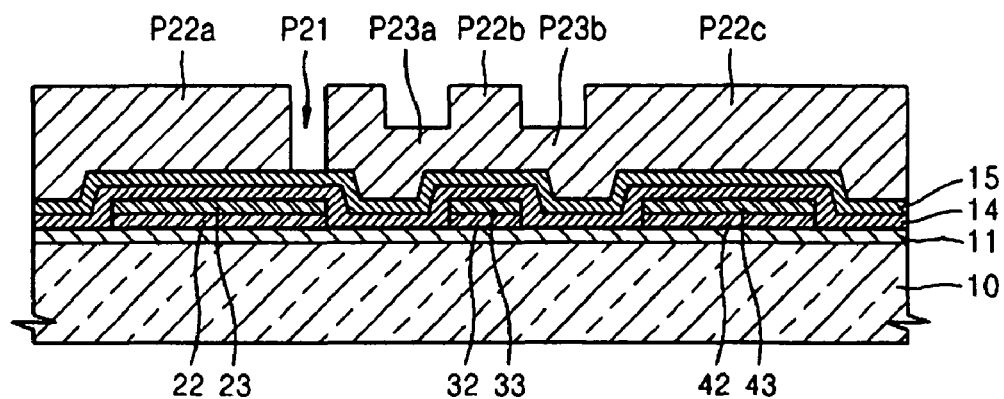

FIG. 6 schematically illustrates a pattern of the second photoresistor P2 remaining after the sensitized portion is removed by the developing process.

A photoresistor portion P21 corresponding to light-transmitting portion M21 of the second mask M2 is removed, and photoresistor portions P22a, P22b, and P22c corresponding to light-blocking portions M22a, M22b, and M22c and photoresistor portions P23a and P23b corresponding to light semi-transmitting portions M23a and M23b remain. In this regard, the thicknesses of photoresistor portions P23a and P23b corresponding to light semi-transmitting portions M23a and M23b are less than those of photoresistor portions P22a, P22b, and P22c corresponding to light-blocking portions M22a, M22b, and M22c. The thickness of photoresistor portions P23a and P23b may be controlled by varying the ratio of a composition used to form the pattern of light semi-transmitting portions M23a and M23b of the second mask M2 and the thickness of the composition.

Figure 7:
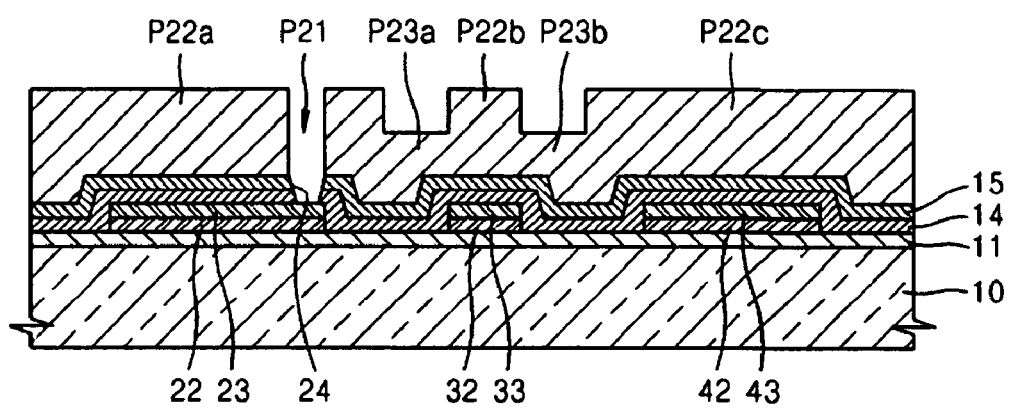

Referring to FIG. 7, when a first etching process is performed by using the remaining photoresistor patterns P22a, P22b, P22c, P23a, and P23b as masks, a part of gate insulating layer 14 and a part of semiconductor layer 15 which correspond to photoresistor P21 and are formed on pixel electrodes 22 and 23 are etched to form a contact hole 24. In this regard, wet etching or dry etching may be used.

Figure 8:
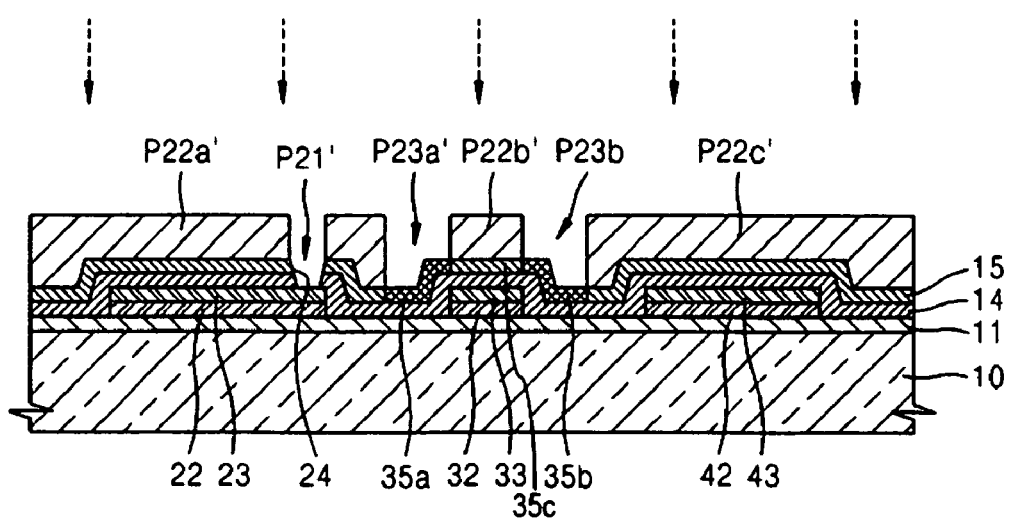

Referring to FIG. 8, photoresistor portions P23a and P23b having low thicknesses are completely removed by an ashing process, and photoresistor portions P22a, P22b, and P22c having high thicknesses remain in patterns P22a', P22b', and P22c' with reduced thicknesses after the ashing process. The ashing process is generally a plasma mediated stripping process by which photoresist, polymer and/or residues are stripped or removed from a substrate upon exposure to the plasma. A N+ or P+ type dopant is injected to exposed semiconductor layer 15 using the remaining photoresistor patterns P22a', P22b', and P22c' as masks to form source/drain regions 35a and 35b of a thin film transistor and a channel region 35c.

Figure 9:
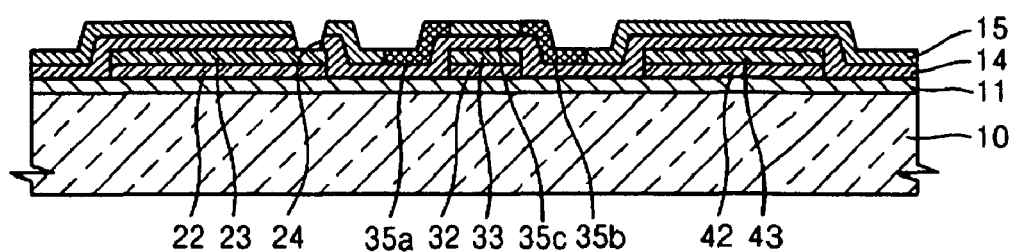

FIG. 9 illustrates a pattern formed on substrate 10 after the remaining photoresistors P22a', P22b', and P22c' are completely removed by a stripping process. Referring to FIG. 9, source/drain regions 35a and 35b of thin film transistor 30 (FIG. 20) in semiconductor layer 15, as the top layer, are doped with impurities, and the channel region 35c is formed on a portion of gate insulating layer 14 between source/drain regions 35a and 35b corresponding to gate electrodes 32 and 33.

Turning now to FIGS. 10 through 13.

Figure 10:
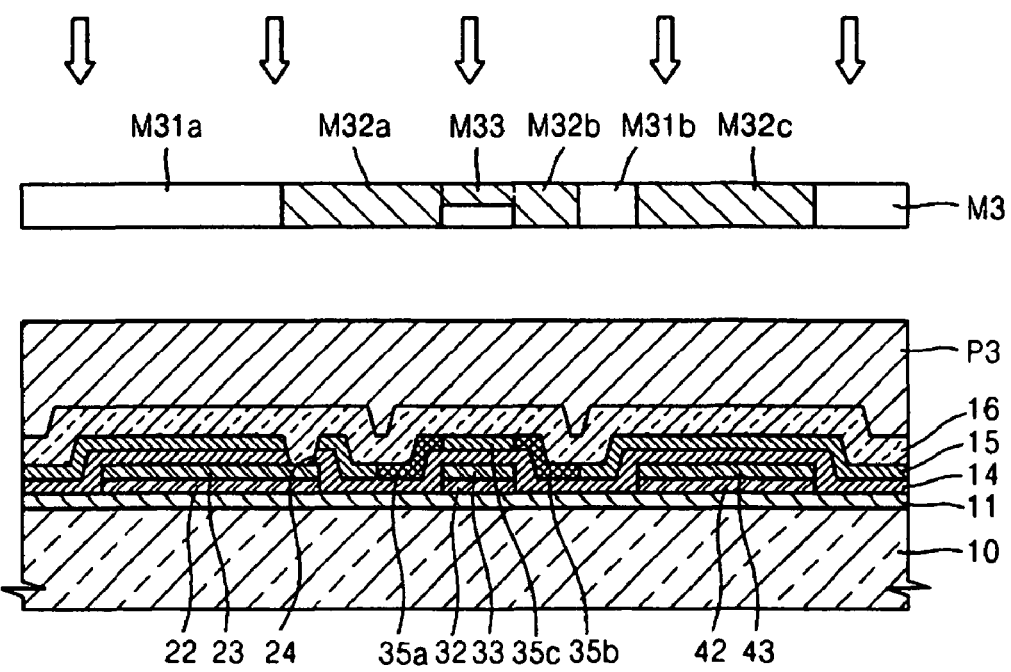
FIGS. 10 through 13 are schematic cross-sectional views illustrating a third mask operation constructed as an embodiment of the present invention.

Referring to FIG. 10, a second metal layer 16 is deposited on the structure formed by the second mask operation as shown in FIGS. 5 through 9. The second metal layer 16 may include at least one metal selected from the group consisting of Mo, Cr, Ti, Ag, Mg, Al, Pt, Pd, Au, Ni, Nd, Ir, Li, and Ca.

A third photoresistor P3 is coated on the second metal layer 16, and a third mask M3 having a predetermined pattern for patterning the third photoresistor P3 is disposed on substrate 10.

The third mask M3 includes light-transmitting portions M31a and M31b, light-blocking portions M32a, M32b, and M32c, and a light semi-transmitting portion M33. The third photoresistor P3 is disposed on substrate 10 and light having a predetermined wavelength is irradiated to sensitize the third photoresistor P3.

Figure 11:
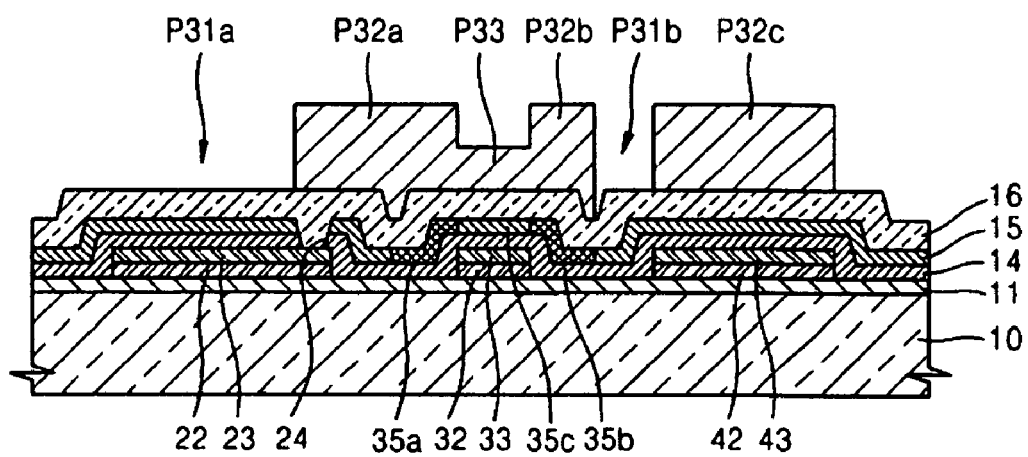

FIG. 11 schematically illustrates a pattern of the third photoresistor P3 remaining after the sensitized portion is removed by the developing process.

Photoresistor portions P31a and P31b corresponding to light-transmitting portions M31a and M31b of the third mask M3 are removed, and photoresistor portions P32a, P32b, and P32c corresponding to the light-blocking portions M32a, M32b, and M32c and a photoresistor portion P33 corresponding to light semi-transmitting portion M33 remain. In this regard, the thickness of photoresistor portion P33 corresponding to light semi-transmitting portion M33 is less than those of photoresistor portions P32a, P32b, and P32c corresponding to light-blocking portions M32a, M32b, and M32c.

Referring to FIG. 12, when a first etching process is firstly performed by using the remaining photoresistor patterns P32a, P32b, P32c, and P33 as masks, a part of semiconductor layer 15 and the second metal layer 16 corresponding to the removed photoresistors P31a and P31b is etched. The removed photoresistor P31a corresponds to pixel electrodes 22, 23, and the removed photoresistor P31b corresponds to the region between thin film transistor 30 and capacitor 40 as shown in FIG. 13. In this regard, wet etching or dry etching may be used.

Referring to FIGS. 12 and 13, photoresistor portion P33 having a low thickness is completely removed after an ashing process, and photoresistor portions P32a, P32b, P32c having high thicknesses remain in patterns P32a', P32b', and P32c' with reduced thicknesses after the ashing process. When a second etching process is performed by using the remaining photoresistor patterns P32a', P32b', and P32c' as masks, a channel layer 35c of semiconductor layer 15 corresponding to a region P33' from which the photoresistor is completely removed is exposed.

Meanwhile, even though not shown, the remaining photoresistor patterns P32a', P32b', and P32c' are completely removed using a stripping process. Thus, the second metal layer 16 connected to source/drain regions 35a and 35b functions as source/drain electrodes 36a and 36b, and the second metal layer 16 patterned so as to correspond to the first electrodes 42 and 43 of capacitor 40 functions as a second electrode 46 of the capacitor 40. In this regard, one of source/drain electrodes 36a and 36b is connected to pixel electrodes 22 and 23 via contact hole 24.

Turning now to FIGS. 14 and 15.

Referring to FIG. 14, a photoresistor P4 is coated on the structure formed according to a third mask operation as shown in FIGS. 10 through 13, and a fourth mask M4 having a predetermined pattern for patterning photoresistor P4 is disposed on substrate 10.

The fourth mask M4 includes a light-transmitting portion M41 and a light-blocking portions M42. The fourth mask M4 is disposed on substrate 10 and light having a predetermined wavelength is irradiated thereto to sensitize the fourth photoresistor P4.

In this regard, the fourth photoresistor P4 may be formed by spin coating at least one organic insulating material selected from the group consisting of polyimide, polyamide, acryl resin, benzocyclobutene, and phenol resin. The fourth photoresistor P4, like the first through third photoresistors P1, P2, and P3, remains after the etching process and functions as a pixel defining layer (PDL) of an organic light emitting display device that will be described later.

FIG. 15 schematically illustrates a pattern of the fourth photoresistor P4 remaining after the sensitized portion is removed by the developing process.

Referring to FIG. 15, a photoresistor portion P41 corresponding to light-transmitting portion M41 of the fourth mask M4 is removed to form an opening 100, and a photoresistor portion 27 corresponding to light-blocking portions M42 remains.

Gate insulating layer 14 and metal layer 23 disposed on pixel electrode 22 corresponding to light-transmitting portion M41 are etched, so that the center of pixel electrode 22 formed by a metal oxide layer 22 is exposed. The fourth photoresistor P4 remaining on the edges of pixel electrodes 22 and 23 functions as PDL 27 of the organic light emitting display device.

According to the present embodiment, the metal layer 23 forming pixel electrode 23 is etched, but the present invention is not limited thereto. If metal layer 23 is etched, metal oxide layer 22 formed of a material having light-transmitting properties may be applied to a bottom emission type organic light emitting display device.

According to another embodiment, however, only gate insulating layer 14 formed on pixel electrodes 22 and 23 is etched, and metal layer 23 may remain. In this regard, metal layer 23 that functions as a reflection layer may be used in a top emission type organic light emitting display device.

Referring to FIG. 16, an organic light emitting layer 28 and an opposite electrode (common electrode) 29 are sequentially formed on the structure of FIG. 15. More specifically, an organic light emitting layer 28 and an opposite electrode 29 are sequentially formed in opening 100.

Organic light emitting layer 28 emits light by electrical operations of pixel electrodes 22 and 23, and a common electrode 29. Even though only organic light emitting layer 28 is shown in FIG. 16, additional thin films may further be formed when a low molecular weight or high molecular weight organic material is used to form organic light emitting layer 28. In addition, the alignment of the thin films (not shown) that may further be formed and organic light emitting layer 28 is not limited.

If organic light emitting layer 28 includes a low molecular weight organic material, a hole transport layer (HTL) and a hole injection layer (HIL) are stacked in a direction from organic light emitting layer 28 to pixel electrodes 22 and 23, and an electron transport layer (ETL) and an electron injection layer (EIL) are stacked in a direction from organic light emitting layer 28 to the opposite electrode 29. A variety of layers may also be stacked. The low molecular weight organic material may include copper phthalocyanine (CuPc), N,N'-Di(naphthalene-1-yl)-N,N'-diphenyl-benzidine (NPB), tris-8-hydroxyquinoline aluminum (Alq3), or the like.

Meanwhile, if organic light emitting layer 28 includes a high molecular weight organic material, only a hole transport layer (HTL) is stacked in a direction from organic light emitting layer 28 to pixel electrodes 22 and 23. The HTL may be formed on pixel electrodes 22 and 23 using poly-(2,4)-ethylene-dihydroxy thiophene (PEDOT), polyaniline (PANI), or the like by inkjet printing, spin coating, or the like. The high molecular weight organic material may include poly-phenylenevinylene (PPV), polyfluorene, or the like, and a color pattern may be formed by inkjet printing, spin coating, or thermal transfer using laser.

The opposite electrode 29, as a common electrode, is deposited on organic light emitting layer 28. In the organic light emitting display device according to the present embodiment, pixel electrodes 22 and 23 are used as anode electrodes, and the opposite electrode 29 is used as a cathode electrode. The polarity of the electrodes may also be reversed.

If the organic light emitting display device is a bottom emission type organic light emitting display device in which an image is realized in a direction toward substrate 10, pixel electrode 22 and 23 are transparent electrodes, and the common electrode 29 is a reflective electrode. In this regard, the reflective electrode may be formed by depositing a low work function metal such as Ag, Mg, Al, Pt, Pd, Au, Ni, Nd, Ir, Cr, Li, Ca, LiF/Ca, LiF/Al, or a compound thereof in a thin layer.

As shown in FIG. 16, in thin film transistor 30, gate electrodes 32, 33 may be formed on substrate 10, and gate electrodes 32, 33 includes a metal oxide layer and a metal layer. A semiconductor layer includes source/drain regions 35a, 36b and channel layer 35c, and the gate insulating layer 14 is formed between the gate electrodes 32, 33 and the semiconductor layer. Source/drain electrodes 36a, 36b are electrically connected to source/drain regions 35a, 35b. Gate insulating layer 14 may be formed in direct contact with gate electrodes 32, 33 and the semiconductor layer. The source/drain electrodes 36a, 36b may be in direct contact with source/drain regions 35a, 35b. Gate insulating layer 14 may cover gate electrodes 32, 33, and the semiconductor layer may cover the gate insulating layer 14.

In capacitor 40, the first electrodes 42, 43 are formed on the same side of a layer on which the gate electrode is formed. The first electrodes 42, 43 are formed of the same material that forms the gate electrodes 32, 33. The first electrodes 42, 43 may be formed in direct contact with the same side of the layer (e.g., buffer layer 11, but not limited to buffer layer 11) with which the gate electrodes 32, 33 are formed in direct contact. A second electrode 46 is formed on the same side of the semiconductor layer on which the source/drain electrodes 36a, 36b are formed. The second electrode 46 is formed of a material used to form source/drain electrodes 36a, 36b. The second electrode 46 may be formed in direct contact with the same side of the semiconductor layer with which the source/drain electrodes 36a, 36b are formed in direct contact. The gate insulating layer 14 may be formed between the first electrodes 42, 43 and the second electrode 46 of capacitor 40.

In organic light emitting device 20, pixel electrodes 22, 23 are formed on a same side of a layer on which gate electrodes 32, 33 are formed. Pixel electrodes 22, 23 may be formed in direct contact with a same side of the layer (e.g., buffer layer 11, but not limited to buffer layer 11) with which gate electrodes 32, 33 are formed in direct contact. Pixel electrodes 22, 23 are formed of a material used to form gate electrodes 32, 33. Pixel electrodes 22, 23 are electrically connected to one of source/drain electrodes 36a, 36b via a contact hole 24. Pixel electrodes 22, 23 may be in direct contact with one of the source/drain electrodes 36a, 36b via contact hole 24. Organic light emitting layer 28 may be disposed on pixel electrodes 22, 23, and a common electrode 29 covers organic light emitting layer 28.

Meanwhile, even though not shown in FIG. 16, a sealing member (not shown) and a moisture absorbent (not shown) may be contained on the opposite electrode 29 to protect organic light emitting layer 28 from external moisture or oxygen.

According to the organic light emitting display device and the method of manufacturing the same according to one or more embodiments of the present invention, the organic light emitting display device having a structure described above may be manufactured using a minimum number of masks, the manufacturing costs may be reduced and the manufacturing process may be simplified.

Hereinafter, an organic light emitting display device and a method of manufacturing the same according to another embodiment of the present invention will be described in detail with reference to FIGS. 17 to 22. FIGS. 17 to 21 are cross-sectional views illustrating a second mask operation constructed as another embodiment of the present invention. FIG. 22 is a cross-sectional view of an organic light emitting display device formed by a manufacture process including the second mask operation shown in FIGS. 17 to 21.

Figure 17:
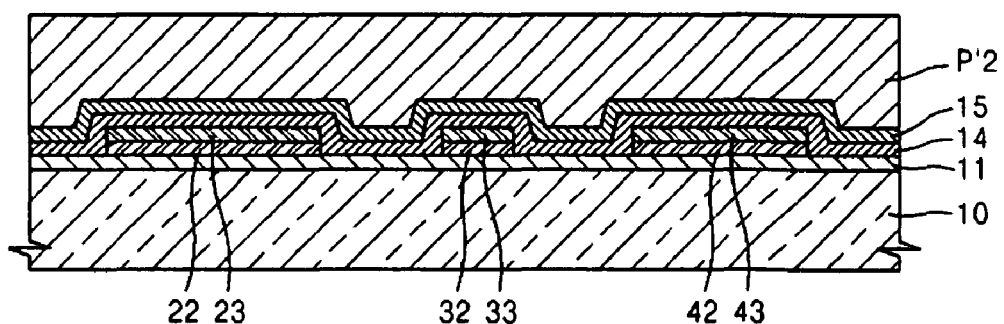
FIGS. 17 through 21 are cross-sectional views illustrating a second mask operation constructed as another embodiment of the present invention.

Referring to FIG. 17, gate insulating layer 14 and semiconductor layer 15 are sequentially formed on pixel electrodes 22 and 23, gate electrodes 32 and 33, and the first electrodes 42 and 43 of capacitor 40 which are formed by the first mask operation M1, and semiconductor layer 15 is formed of polycrystal silicon obtained by the crystallization.

The second photoresistor P2 is coated on semiconductor layer 15, and a second mask M2' having a predetermined pattern for patterning photoresistor P2 is disposed on substrate 10.

The second mask M'2 is a half-tone mask including a light-transmitting portion M21, light-blocking portions M'22a, M'22b, and M'22c, and light semi-transmitting portions M'23a, M'23b, and M'23c.

The second mask M'2 having the pattern is disposed on substrate 10 and the second photoresistor P'2 is exposed to light having a predetermined wavelength.

Figure 18:
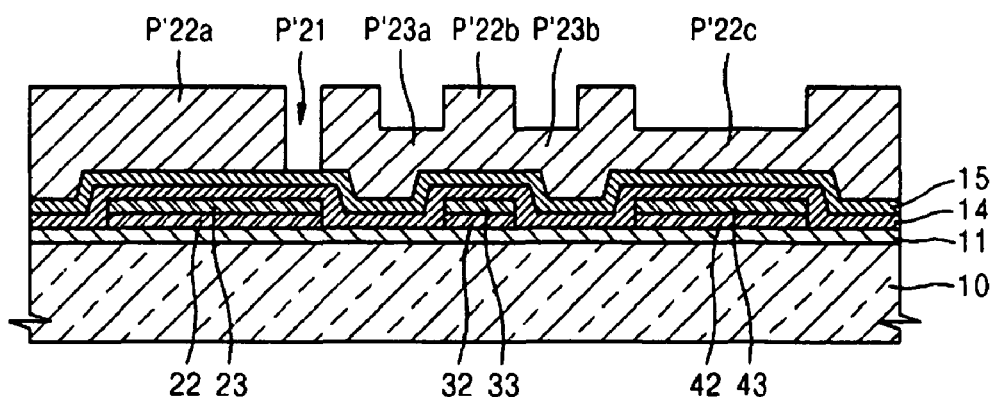

FIG. 18 schematically illustrates a pattern of the second photoresistor P2 remaining after the sensitized portion is removed by the developing process.

Photoresistor portion P'21 corresponding to light-transmitting portion M'21 of the second mask M'2 is removed, and photoresistor portions P'22a, P'22b, and P'22c corresponding to light-blocking portions M'22a, M'22b, and M'22c and photoresistor portions P'23a, P'23b, and P'23c corresponding to light semi-transmitting portions M'23a, M'23b, and M'23c remain.

Figure 19:
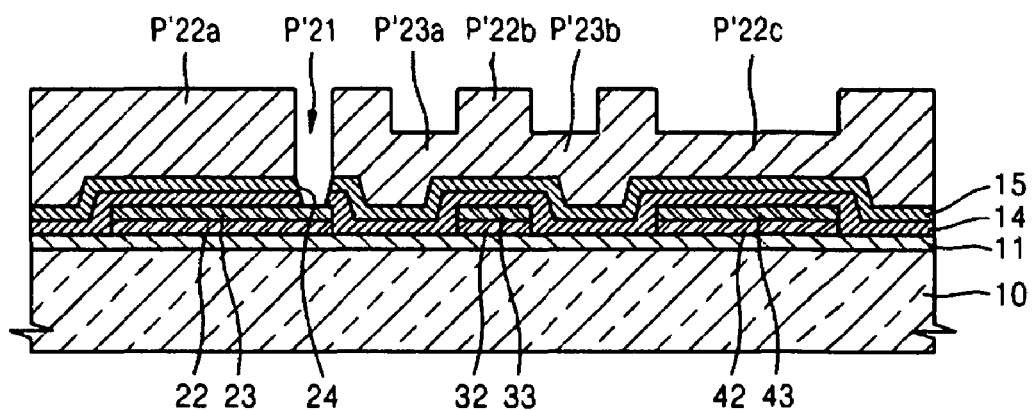

Referring to FIG. 19, when a first etching process is performed by using the remaining photoresistor patterns P'22a, P'22b, P'22c, P'23a, P'23b, and P'23c as masks, a part of gate insulating layer 14 and a part of semiconductor layer 15 which correspond to the removed photoresistor P21 and are formed on pixel electrodes 22 and 23 are etched to form a contact hole 24.

Figure 20:
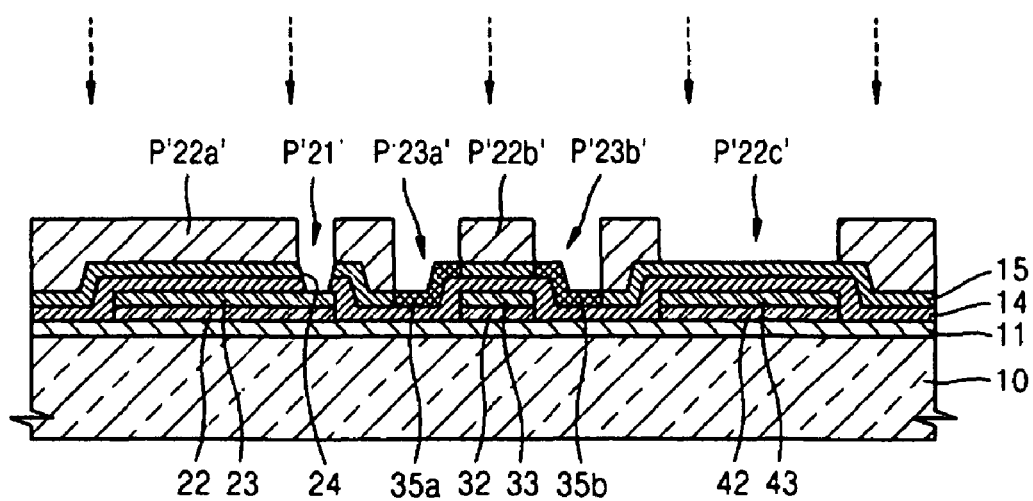
Figure 21:
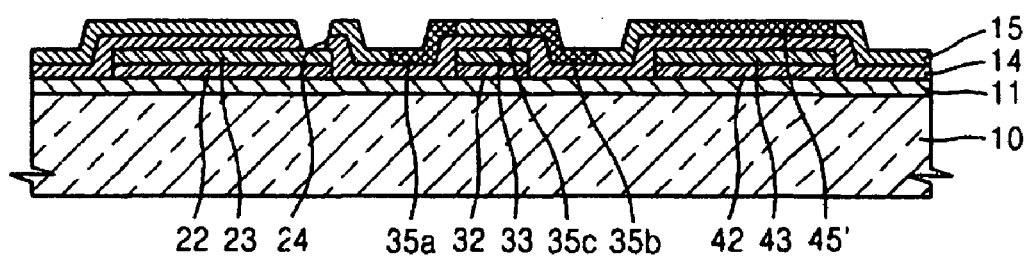
Figure 22:
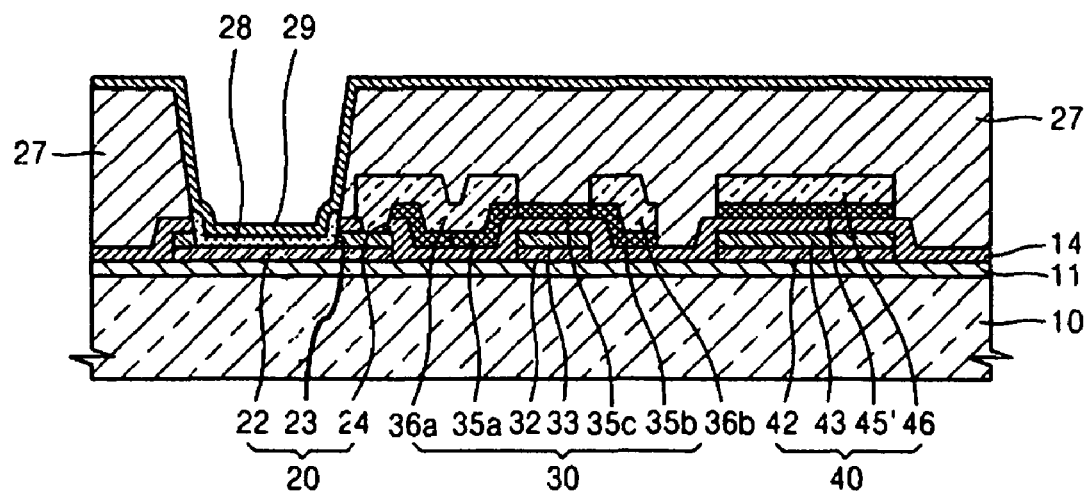
FIG. 22 is a cross-sectional view of an organic light emitting display device formed by a manufacture process including the second mask operation shown in FIGS. 17 through 21.

Referring to FIGS. 20 to 22, photoresistor portions P'23a, P'23b, and P'23c having low thicknesses are completely removed after an ashing process, and photoresistor portions P'22a, P'22b, and P'22c having high thicknesses remain in patterns P22a', P22b', and P22c' with reduced thicknesses after the ashing process. An N+ or P+ type dopant is injected to the exposed semiconductor layer 15 of thin film transistor 30 and capacitor 40 using the remaining photoresistor patterns P'22a', P'22b', and P'22c' as masks to form source/drain regions 35a and 35b of a thin film transistor 30 and the second electrode 45' of capacitor 40.

According to the organic light emitting display device, semiconductor layer 15 of capacitor 40 into which the impurity is injected may function as the second electrode 45' of the capacitor 40.

According to the present invention, the organic light emitting display device having the structure described above may be manufactured using a minimum number of masks. Thus, the manufacturing costs may be reduced and the manufacturing process may be simplified.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, comprising:
a substrate;
at least one thin film transistor comprising a gate electrode formed on the substrate and comprising:
 a metal oxide layer and a metal layer;
 a semiconductor layer comprising source/drain regions and a channel layer, wherein a gate insulating layer is formed between the gate electrode and the semiconductor layer; and
 source/drain electrodes connected to the source/drain regions;
at least one capacitor comprising a first electrode formed on a layer on which the gate electrode is formed using a material used to form the gate electrode, and a second electrode formed on a layer on which the source/drain electrodes are formed using a material used to form the source/drain electrodes, wherein the gate insulating layer is formed between the first electrode and the second electrode of the capacitor; and
at least one organic light emitting device comprising:
 a pixel electrode formed on a layer on which the gate electrode is formed using a material used to form the gate electrode and connected to the source/drain electrodes via a contact hole;
 an organic light emitting layer disposed on the pixel electrode; and
 an opposite electrode covering the organic light emitting layer.

2. The organic light emitting display device of claim 1, further comprising a pixel defining layer covering edges of the pixel electrode, the thin film transistor, and the capacitor.

3. The organic light emitting display device of claim 1, wherein the metal oxide layer and the metal layer are sequentially stacked on the substrate.

4. The organic light emitting display device of claim 2, wherein the metal layer of the pixel electrode is positioned only on edges of the metal oxide layer.

5. The organic light emitting display device of claim 4, wherein light emitted from the organic light emitting layer proceeds toward the substrate so that an image is formed in the direction facing toward the substrate.

6. The organic light emitting display device of claim 1, wherein the semiconductor layer is formed of polycrystal silicon.

7. The organic light emitting display device of claim 6, wherein the source/drain regions are doped with an impurity.

8. The organic light emitting display device of claim 1, further comprising the semiconductor layer between the second electrode of the capacitor and the gate insulating layer.

9. The organic light emitting display device of claim 1, wherein the metal oxide layer comprises at least one metal oxide selected from the group consisting of ITO, IZO, ZnO, and $In_2O_3$.

10. The organic light emitting display device of claim 1, wherein the metal layer comprises at least one metal selected from the group consisting of Mo, Cr, Ti, Ag, Mg, Al, Pt, Pd, Au, Ni, Nd, Ir, Li, and Ca.

11. The organic light emitting display device of claim 1, further comprising a buffer layer disposed on the substrate.

12. A method of manufacturing an organic light emitting display device, the method comprising:
a first mask operation comprising simultaneously forming a pixel electrode of an organic light emitting device, a gate electrode of a thin film transistor, and a first electrode of a capacitor by sequentially depositing a metal oxide layer and a first metal layer on a substrate;
a second mask operation comprising sequentially depositing a gate insulating layer and a semiconductor layer on a structure formed by the first mask operation, forming a contact hole by exposing a portion of the pixel electrode, and forming source/drain regions and a channel layer between the source/drain regions by doping an impurity on a portion of the semiconductor layer of the thin film transistor;
a third mask operation comprising simultaneously forming source/drain electrodes connected to the source/drain regions of the thin film transistor and a second electrode of a capacitor by depositing a second metal layer on a structure formed by the second mask operation, and connecting one of the source/drain electrodes to the pixel electrode via the contact hole;
a fourth mask operation comprising forming a pixel defining layer comprising an opening so as to expose a portion of the pixel electrode by depositing a material used to form the pixel defining layer on a structure formed by the third mask operation; and
sequentially forming an organic light emitting layer and an opposite electrode on the structure formed by the fourth mask operation.

13. The method of claim 12, wherein the semiconductor layer is formed by forming amorphous silicon on the substrate and crystallizing the amorphous silicon in the second mask operation.

14. The method of claim 12, wherein the second mask operation is performed using a half-tone mask comprising a light-transmitting portion corresponding to the contact hole, and a light semi-transmitting portion corresponding to the source/drain regions.

15. The method of claim 12, wherein the third mask operations is performed using a half-tone mask comprising a light-transmitting portion corresponding to the pixel electrode, and a light semi-transmitting portion corresponding to a channel region.

16. The method of claim 12, wherein the fourth mask operation is performed by forming the pixel defining layer so as to expose the metal oxide layer forming the pixel electrode.

17. The method of claim 12, wherein the second mask operation is performed by forming the capacitor such that the semiconductor layer is formed between the second electrode of the capacitor and the gate insulating layer.

18. The method of claim 17, wherein the second mask operation is performed using a half-tone mask comprising a light-transmitting portion corresponding to the contact hole, and light semi-transmitting portions respectively corresponding to the source/drain regions and the first electrode of the capacitor.

19. The method of claim 12, wherein the metal oxide layer comprises at least one metal oxide selected from the group consisting of ITO, IZO, ZnO and $In_2O_3$ in the first mask operation.

20. The method of claim 12, wherein the metal layer comprises at least one metal selected from the group consisting of Mo, Cr, Ti, Ag, Mg, Al, Pt, Pd, Au, Ni, Nd, Ir, Li, and Ca in the first mask operation.

21. The method of claim 12, further comprising forming a buffer layer on the substrate before the first mask operation.

* * * * *